(12) United States Patent
Wang et al.

(10) Patent No.: US 9,064,699 B2
(45) Date of Patent: Jun. 23, 2015

(54) METHODS OF FORMING SEMICONDUCTOR PATTERNS INCLUDING REDUCED DISLOCATION DEFECTS AND DEVICES FORMED USING SUCH METHODS

(71) Applicants: Wei-E Wang, Austin, TX (US); Mark S. Rodder, Dallas, TX (US); Robert C. Bowen, Mount Laurel, NJ (US)

(72) Inventors: Wei-E Wang, Austin, TX (US); Mark S. Rodder, Dallas, TX (US); Robert C. Bowen, Mount Laurel, NJ (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/258,704

(22) Filed: Apr. 22, 2014

(65) Prior Publication Data

US 2015/0093884 A1   Apr. 2, 2015

Related U.S. Application Data

(60) Provisional application No. 61/884,216, filed on Sep. 30, 2013, provisional application No. 61/923,034, filed on Jan. 2, 2014.

(51) Int. Cl.
 *H01L 21/20* (2006.01)
 *H01L 21/02* (2006.01)
 *H01L 21/762* (2006.01)

(52) U.S. Cl.
 CPC ...... *H01L 21/02488* (2013.01); *H01L 21/7624* (2013.01); *H01L 21/02532* (2013.01); *H01L 21/02538* (2013.01); *H01L 21/02546* (2013.01)

(58) Field of Classification Search
 CPC .............. H01L 21/0243; H01L 21/02634; H01L 21/02642
 USPC ............................................. 438/491; 117/90
 See application file for complete search history.

(56) References Cited

U.S. PATENT DOCUMENTS

| | | |
|---|---|---|
| 6,500,257 B1 | 12/2002 | Wang et al. |
| 6,617,261 B2 | 9/2003 | Wong et al. |
| 6,784,074 B2 | 8/2004 | Shchukin et al. |
| 6,936,851 B2 | 8/2005 | Wang |
| 7,361,526 B2 | 4/2008 | Maa et al. |
| 7,361,576 B2 | 4/2008 | Imer et al. |
| 7,459,380 B2 | 12/2008 | Bour et al. |
| 7,462,867 B2 | 12/2008 | Tezen |

(Continued)

FOREIGN PATENT DOCUMENTS

WO   WO 2013/117153 A1   8/2013

OTHER PUBLICATIONS

Schenk et al. "Growth of thick, continuous GaN layers on 4-in. Si substrates by metalorganic chemical vapor deposition", *Journal of Crystal Growth*, vol. 314, Issue 1, Jan. 2011, pp. 85-91.

(Continued)

*Primary Examiner* — Caridad Everhart
(74) *Attorney, Agent, or Firm* — Myers Bigel Sibley & Sajovec, P.A.

(57) ABSTRACT

Methods of forming semiconductor patterns including reduced dislocation defects and devices formed using such methods are provided. The methods may include forming an oxide layer on a substrate and forming a recess in the oxide layer and the substrate. The methods may further include forming an epitaxially grown semiconductor pattern in the recess that contacts a sidewall of the substrate at an interface between the oxide layer and the substrate and defines an upper surface of a void in the recess in the substrate.

20 Claims, 14 Drawing Sheets

(56) References Cited

U.S. PATENT DOCUMENTS

| | | | |
|---|---|---|---|
| 7,682,944 B2 | 3/2010 | Brandes et al. | |
| 7,777,250 B2 | 8/2010 | Lochtefeld | |
| 8,119,494 B1 | 2/2012 | Vellianitis | |
| 8,274,097 B2 | 9/2012 | Cheng | |
| 8,313,967 B1 | 11/2012 | Lee et al. | |
| 8,324,660 B2 | 12/2012 | Lochtefeld et al. | |
| 8,344,242 B2 | 1/2013 | Fiorenza et al. | |
| 8,384,196 B2 | 2/2013 | Cheng et al. | |
| 8,415,718 B2 | 4/2013 | Xu | |
| 8,450,190 B2 | 5/2013 | Cheng et al. | |
| 8,502,263 B2 | 8/2013 | Li et al. | |
| 8,519,436 B2 | 8/2013 | Lochtefeld et al. | |
| 2003/0092230 A1* | 5/2003 | Koike et al. | 438/200 |
| 2003/0203531 A1* | 10/2003 | Shchukin et al. | 438/77 |
| 2008/0070355 A1 | 3/2008 | Lochtefeld et al. | |
| 2009/0039361 A1 | 2/2009 | Li et al. | |
| 2010/0012976 A1 | 1/2010 | Hydrick et al. | |
| 2011/0316000 A1* | 12/2011 | Beaumont et al. | 257/76 |
| 2012/0241755 A1 | 9/2012 | Romanov et al. | |
| 2012/0305940 A1 | 12/2012 | Adam et al. | |
| 2013/0037857 A1 | 2/2013 | Von Kanel et al. | |
| 2013/0069079 A1 | 3/2013 | Kim | |
| 2013/0200391 A1 | 8/2013 | Bedair et al. | |
| 2013/0233238 A1 | 9/2013 | Vincent et al. | |

OTHER PUBLICATIONS

Czornomaz et al. "*An Integration Path for Gate-first UTB 111-V-on-insulator MOSFETs with Silicon, using Direct Wafer Bonding and Donor Wafer Recycling,*" IEDM 2012.

Hook et al. "Transistor Matching and Silicon Thickness Variation in ETSOI Technology," IEDM 2011.

Houghton, D.C. "Strain relaxation kinetics in Si1x Ge x/Si heterostructures", *Journal of Applied Physics*, vol. 70, 2136, 1991.

Huang et al. "A CMOS-compatible approach to fabricate an ultra-thin germanium-on-insulator with large tensile strain for Si-based light emission," *Optics Express*, 21, 640 (2013).

Langdo et al. "High quality Ge on Si by epitaxial necking", *Applied Physics Letters*, vol. 76, 3700, (2000).

Lee et al. "Strain-relieved, dislocation-free In x Ga 1 x As Ga As (001) heterostructure by nanoscale-patterned growth", *Applied Physics Letters*, vol. 85, 4181, (2004).

Leonhardt, Darin. "Selective epitaxial growth techniques to integrate high-quality germanium on silicon", Dissertation, University of New Mexico, May 2011, 243 Pages.

Mino et al. "Development of 260 nm band deep-ultraviolet light emitting diodes on Si substrates", *Proc. of SPIE*, vol. 8625, Mar. 2013.

Pillarisetty et al. "High Mobility Strained Germanium Quantum Well Field Effect Transistor as the P-Channel Device Option for Low Power (Vcc=0.5 V) III-V CMOS Architecture," IEEE, VLSI 2010.

Radosavljevic et al. "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," IEEE, IEDM 2011.

Schenk et al. "Growth of thick, continuous GaN layers on 4-in. Si substrates by metalorganic chemical vapor deposition", *Journal of Crystal Growth*, vol. 314, Issue 1, Jan. 2011, pp. 85-91 (Abstract Only).

Shichijo et al. "Fabrication of III-V on Insulator Structures on Si Using Microchannel Epitaxy with a Two-Step Growth Technique", *The Japan Society of Applied Physics*, vol. 46, No. 9A, 2007, pp. 5930-5934.

Zhu et al. "Defect Reduction in Semi-Polar (1122) Gallium Nitride Grown Using Epitaxial Lateral Overgrowth", *Japanese Journal of Applied Physics*, vol. 52 (2013), 08JB01.

* cited by examiner

DISLOCATION DEFECTS

METHODS OF FORMING SEMICONDUCTOR PATTERNS INCLUDING REDUCED DISLOCATION DEFECTS AND DEVICES FORMED USING SUCH METHODS

CROSS-REFERENCE TO RELATED APPLICATIONS

This application claims priority of U.S. Provisional Application Ser. No. 61/884,216, entitled FORMATION OF DEFECT-FREE EPITAXIAL LAYERS ONTO LATTICE-MISMATCHED SUBSTRATES, filed in the USPTO on Sep. 30, 2013, and U.S. Provisional Application Ser. No. 61/923,034, entitled FORMATION OF LARGE AREA DEFECT-FREE AND STRESS-FREE EPITAXIAL LAYERS ONTO LATTICE-MISMATCHED SUBSTRATES, filed in the USPTO on Jan. 2, 2014, the disclosures of all of which are hereby incorporated by reference in their entireties.

FIELD

The present disclosure generally relates to the field of electronics and, more particularly, to methods of forming integrated circuit devices.

BACKGROUND

Hetero-integration of dissimilar semiconductor materials has been developed to improve performance of integrated circuit devices. Hetero-integration, however, may result in dislocation defects due to strain induced by lattice mismatch and may not improve performance.

SUMMARY

A method of forming a semiconductor pattern may include forming an oxide layer on a substrate, forming a recess in the oxide layer and the substrate and forming an epitaxially grown semiconductor pattern in the recess, which may contact a sidewall of the substrate at an interface between the oxide layer and the substrate and may define an upper surface of a void in the recess in the substrate.

According to various embodiments, forming the epitaxially grown semiconductor pattern may include epitaxially growing a lower semiconductor pattern defining the upper surface of the void in the recess in the substrate using the sidewall of the substrate at the interface between the oxide layer and the substrate as a first seed layer and epitaxially growing an upper semiconductor pattern in the recess using the lower semiconductor pattern as a second seed layer.

In various embodiments, the void may expose the sidewall of the substrate.

In various embodiments, the lower semiconductor pattern may include a material different from the upper semiconductor pattern. The lower semiconductor pattern may include silicon germanium (SiGe), and the upper semiconductor pattern may include germanium (Ge).

According to various embodiments, the substrate may include a first semiconductor layer and a second semiconductor layer extending between the oxide layer and the first semiconductor layer. The second semiconductor layer may include germanium (Ge), silicon germanium (SiGe), indium gallium arsenide (InGaAs), or a III-V compound, and the epitaxially grown semiconductor pattern may contact a sidewall of the second semiconductor layer.

In various embodiments, a thickness of the second semiconductor layer may be in a range of about 100 nm to about 1 μm.

In various embodiments, forming the recess may include forming a lower portion of the recess in the substrate having an aspect ratio greater than 3 such that the void may expose the sidewall of the substrate.

In various embodiments, forming the recess may include forming an upper portion of the recess through the oxide layer having an aspect ratio greater than 1.

According to various embodiments, the method may further include implanting oxygen ions into the substrate to form an insulating region under the recess.

According to various embodiments, the method widening a portion of the recess in the substrate at the interface of the substrate and the oxide layer to form an undercut region.

A method of forming a fin-shaped semiconductor pattern may include forming an oxide layer on a substrate, forming a recess through the oxide layer and in the substrate and performing a first epitaxial growth process to form an overhang seed layer in the recess using a sidewall of the substrate at an interface between the oxide layer and the substrate as a first seed layer. The overhang seed layer may define an upper surface of a void in the recess. The method may also include performing a second epitaxial growth process to form a semiconductor pattern in the recess using the overhang seed layer as a second seed layer and recessing the oxide layer to form the fin-shaped semiconductor pattern by exposing an upper portion of the semiconductor pattern.

In various embodiments, performing the first epitaxial growth process may further include forming a bottom seed pattern on a bottom of the recess. The overhang seed layer may be isolated from the bottom seed pattern.

According to various embodiments, the substrate may include a first semiconductor layer and a second semiconductor layer extending between the oxide layer and the first semiconductor layer. The second semiconductor layer may include germanium (Ge), silicon germanium (SiGe), indium gallium arsenide (InGaAs), or a III-V compound, and the recess may expose a sidewall of the second semiconductor layer including the first seed layer.

In various embodiments, a thickness of the second semiconductor layer may be in a range of about 100 nm to about 1 μm.

In various embodiments, the method may further include performing an anneal process between performing the first and second epitaxial growth processes.

According to various embodiments, forming the recess may include forming a lower portion of the recess in the substrate having an aspect ratio greater than 3 such that the void may expose the sidewall of the substrate.

In various embodiments, forming the recess may include forming an upper portion of the recess through the oxide layer having an aspect ratio greater than 1.

A method of forming a semiconductor layer may include sequentially forming a semiconductor seed layer and an oxide layer on the substrate and forming a plurality of recesses in the oxide layer and the semiconductor seed layer. The method may also include epitaxially growing a plurality of semiconductor patterns in the respective plurality of recesses using portions of sidewalls of the semiconductor seed layer at an interface between the oxide layer and the semiconductor seed layer as seed layers until upper portions of the plurality of semiconductor patterns protrude from the respective plurality of recesses. The plurality of semiconductor patterns may define upper surfaces of a plurality of voids in the respective plurality of recesses. The method may further include epitaxially growing the semiconductor layer extending on the oxide layer using the plurality of semiconductor patterns as seed layers.

According to various embodiments, epitaxially growing the plurality of semiconductor patterns may include epitaxially growing a plurality of lower semiconductor patterns defining the upper surfaces of the respective plurality of voids using the portions of sidewalls of the semiconductor seed layer at the interface between the oxide layer and the semiconductor seed layer as the seed layers and epitaxially growing a plurality of upper semiconductor patterns in the respective plurality of recesses from the respective plurality of lower semiconductor patterns.

In various embodiments, epitaxially growing the plurality of upper semiconductor patterns may include growing the plurality of upper semiconductor patterns to protrude from the respective plurality of recesses, and epitaxially growing the semiconductor layer may include laterally growing the plurality of upper semiconductor patterns until adjacent ones of the plurality of upper semiconductor patterns contact each other.

In various embodiments, forming the plurality of recesses may include forming lower portions of the plurality of recesses in the semiconductor seed layer. Each of the lower portions of the plurality of recesses may have an aspect ratio greater than 3 such that the each of the plurality of voids may expose the sidewalls of the semiconductor seed layer.

According to various embodiments, a thickness of the semiconductor seed layer may be in a range of about 100 nm to about 1 µm.

An integrated circuit device including a fin-shaped semiconductor pattern may include an oxide layer on a substrate and a recess in the oxide layer and the substrate. A first depth of the recess in the substrate may be more than three times greater than a second depth of recess in the oxide layer. The device may also include an epitaxially grown semiconductor pattern in the recess. The epitaxially grown semiconductor pattern may contact a sidewall of the substrate at an interface between the oxide layer and the substrate and may define an upper surface of a void in the recess in the substrate. An upper portion of the epitaxially grown semiconductor pattern may be exposed by the oxide layer.

According to various embodiments, the substrate may include a first semiconductor layer and a second semiconductor layer extending between the oxide layer and the first semiconductor layer. The second semiconductor layer may include germanium (Ge), silicon germanium (SiGe), indium gallium arsenide (InGaAs), or a III-V compound, and the epitaxially grown semiconductor pattern may contact a sidewall of the second semiconductor layer adjacent of the oxide layer.

In various embodiments, a thickness of the second semiconductor layer may be about in a range of about 100 nm to about 1 µm.

In various embodiments, the recess may include a lower portion of the recess in the substrate having an aspect ratio greater than 3 such that the void may expose the sidewall of the substrate.

In various embodiments, the recess may include an upper portion of the recess through the oxide layer having an aspect ratio greater than 1.

According to various embodiments, the device may further include an insulating region including oxygen under the recess.

According to various embodiments, a portion of the recess in the substrate adjacent to the oxide layer may have a width greater than a portion of the recess adjacent a bottom of the recess.

DETAILED DESCRIPTION

Figure 1:
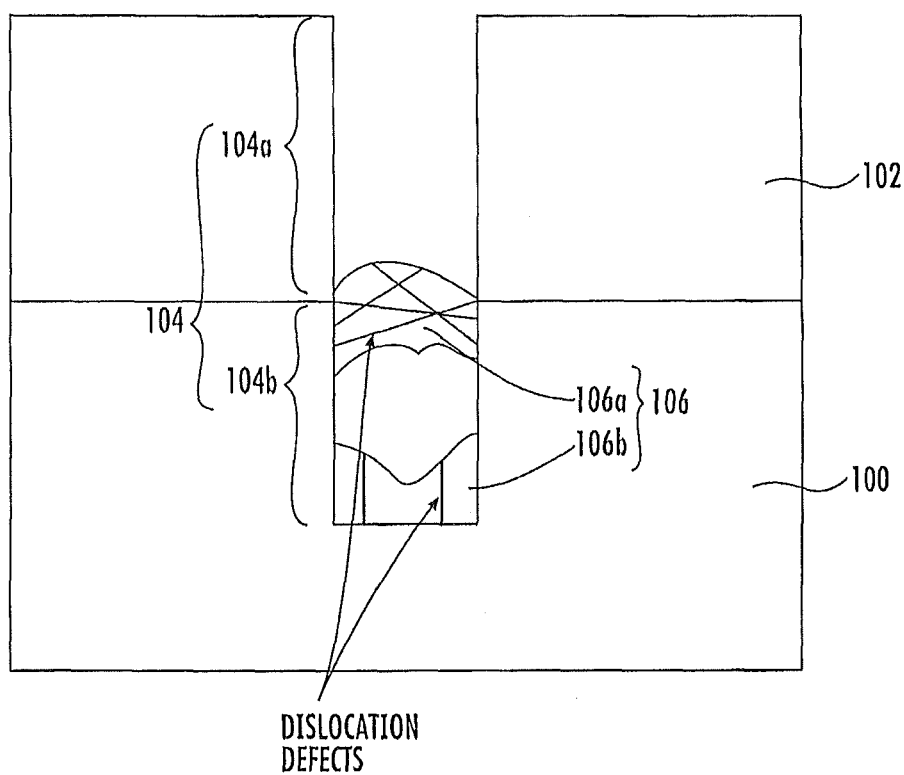
FIGS. 1 through 4 are cross-sectional views illustrating intermediate structures provided in operations of forming a semiconductor pattern according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise.

It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

FIGS. 1 through 4 are cross-sectional views illustrating intermediate structures provided in operations of forming a semiconductor pattern according to some embodiments of the present inventive concept.

Referring to FIG. 1, operations of forming a semiconductor pattern may include forming an oxide layer 102 on a substrate 100 and forming a recess 104. For example, the oxide layer 102 may be a silicon oxide layer, and the substrate 100 may be a bulk silicon substrate. The recess 104 may include an upper portion of the recess 104a in the oxide layer 102 and a lower portion of the recess 104b in the substrate 100.

According to FIG. 1, the operations may include performing a first epitaxial growth process to form seed patterns 106, an overhang seed pattern 106a and a bottom seed pattern 106b, which include a semiconductor material. The semiconductor material may be, for example, germanium, silicon germanium, indium gallium arsenide, or III-V compound. Other materials may also be used.

Epitaxial growth processes form semiconductor patterns on a reactive surface that has dangling bonds but do not form semiconductor patterns on an unreactive surface that does not have dangling bonds. Accordingly, as illustrated in FIG. 1, the first epitaxial growth process may selectively form the seed patterns 106 on a surface of the substrate 100 in the recess 104 that is reactive and may not form semiconductor patterns on a surface of the oxide layer 102 in the recess 104 that is not reactive. Specifically, the overhang seed pattern 106a may be formed using a sidewall of the recess 104 in the substrate 100 at an interface between the oxide layer 102 and the substrate 100 as a seed layer, and the bottom seed pattern 106b may be formed using the substrate 100 as a seed layer. It will be understood that the sidewall of the substrate 100 at the interface between the substrate 100 and the oxide layer 102 may include a portion of the sidewall of the substrate 100 adjacent that interface. The overhang seed pattern 106a may contact the sidewall of the substrate 100 at the interface between the oxide layer 102 and the substrate 100.

It will be understood that a growth rate of a semiconductor pattern formed using the first epitaxial growth process may decrease along a depth direction of the lower portion of the recess 104b because amount of reactants diffused into the lower portion of the recess 104b may decrease along the depth direction. Accordingly, the overhang seed pattern 106a formed at the interface between the oxide layer 102 and the substrate 100 may grow fast and may inhibit diffusion of reactants into the lower portion of the recess 104b such that a void may be formed in the lower portion of the recess 104b. The void may disconnect the overhang seed pattern 106a from the bottom seed pattern 106b and may thus at least partially leave a sidewall of the lower portion of the recess 104b exposed.

Still referring to FIG. 1, the overhang seed pattern 106a and the bottom seed pattern 106b may include dislocation defects represented by straight lines, which originate from interfaces between the substrate 100 and the seed patterns 106. Vertical and horizontal straight lines represent respective vertical and horizontal dislocation defects. Dislocation defects may be generated because of the strain induced by lattice mismatch at the interfaces between the substrate 100 and the seed patterns 106.

The bottom seed pattern 106b may include dislocation defects having various directions, which originate from the interface between the substrate 100 and the bottom seed pattern 106b, including vertical dislocation defects. The dislocation defects in the bottom seed pattern 106b, however, may not propagate into the overhang seed pattern 106a because the void in the lower portion of the recess 104b may disconnect the overhang seed pattern 106a and the bottom seed pattern 106b. Stated in other words, the void may reduce or minimize communication between the overhang seed pattern 106a and the bottom seed pattern 106b. Accordingly, the overhang seed pattern 106a may not include the dislocation defects originating from the interface between the substrate 100 and the bottom seed pattern 106b and may thus only include dislocation defects originating from the interface between the substrate 100 and the overhang seed pattern 106a. The overhang seed pattern 106a may include horizontal dislocation defects but may not include vertical dislocation defects because of an orientation of the interface between the substrate 100 and the overhang seed pattern 106a.

It will be understood that aspect ratios of the upper and lower portions of the recess 104a and 104b can affect a shape and a position of the void. Accordingly, the aspect ratios of the upper and lower portions of the recess 104a and 104b (in relation to one another) may be predetermined to form the void disconnecting the overhang seed pattern 106a from the bottom seed pattern 106b such that propagation of the dislocation defects in the bottom seed pattern 106b into the overhang seed pattern 106a may be reduced or minimized.

In some embodiments, the aspect ratio of the upper portion of the recess 104a may be greater than 1, and the aspect ratio of the lower portion of the recess 104b may be greater than 3. In some embodiments, the upper and lower portions of the recess 104a and 104b may have substantially the same width, and a depth of the lower portion of the recess 104b may be more than three times greater than a depth of the upper portion of the recess 104a.

Figure 2:
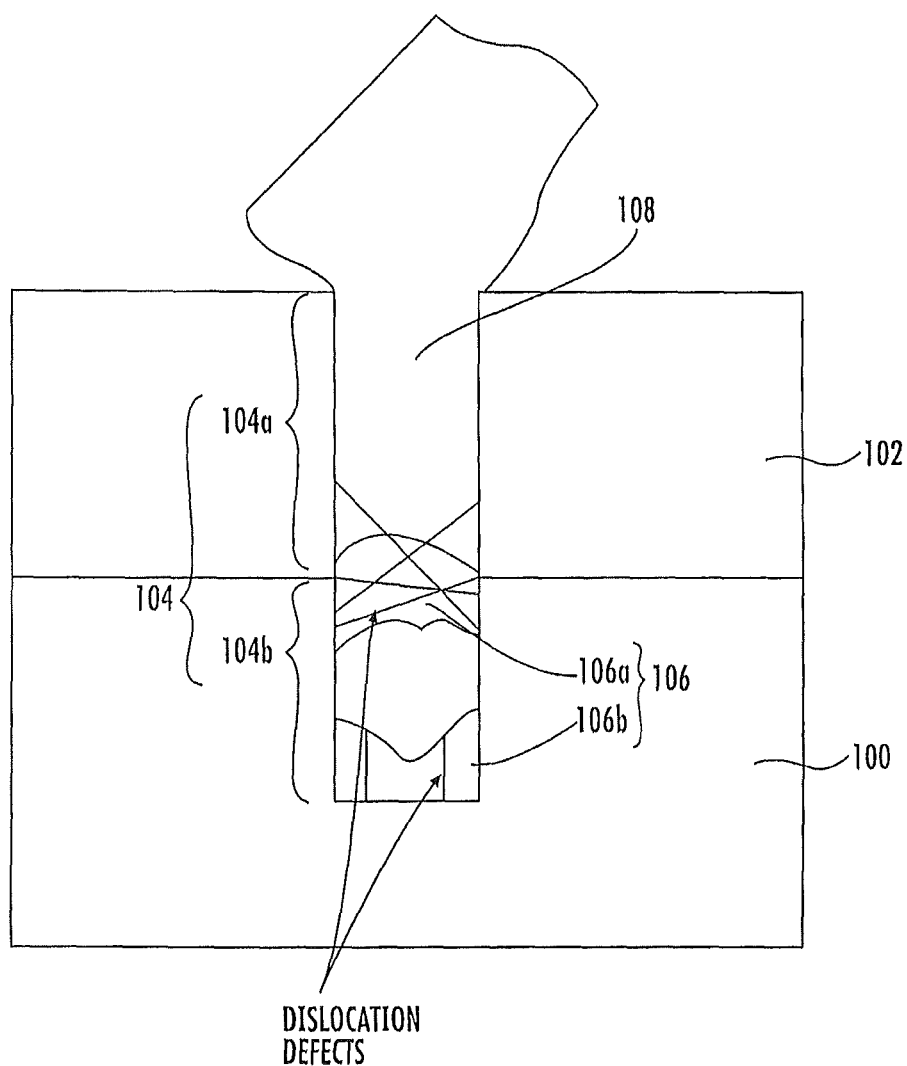

Referring now to FIG. 2, the operations may include performing a second epitaxial growth process using the overhang seed pattern 106a as a seed layer to form a preliminary semiconductor pattern 108. As illustrated in the FIG. 2, horizontal dislocation defects in the overhang seed pattern 106a may propagate into the preliminary semiconductor pattern 108 during the second epitaxial growth process. It will be understood, however, that a majority of the horizontal dislocation defects may be trapped in the oxide layer 102 and thus an upper portion of the preliminary semiconductor pattern 108 may not include or may be substantially free of horizontal dislocation defects. The thickness of the oxide layer 102 may be predetermined to form the upper portion of the recess 104a having the aspect ratio higher than 1 such that substantially all horizontal dislocation defects may be trapped by the oxide layer 102.

Further, the upper portion of the preliminary semiconductor pattern 108 may not include vertical dislocation defects because the overhang seed pattern 106a may not include vertical dislocation defects as discussed with reference to FIG. 1. Accordingly, the upper portion of the preliminary semiconductor pattern 108 may not include dislocation defects or may be substantially free of dislocation defects.

The second epitaxial growth process may be performed until the preliminary semiconductor pattern 108 is overgrown such that the upper portion of the preliminary semiconductor pattern 108 protrudes from the recess 104. It will be understood that the first and second epitaxial growth processes may be performed in an in-situ manner, in which the first and second epitaxial growth processes are performed in the same process chamber.

The operations may include planarizing the upper portion of the preliminary semiconductor pattern 108 to form a semiconductor pattern 108a (FIG. 3) in the recess 104. For example, an isotropic etching process or a chemical mechanical polishing (CMP) process may be used for planarization. In some embodiments, an upper portion of the oxide layer 102 may be partially removed. After planarizing the upper portion of the preliminary semiconductor pattern 108, upper surfaces of the oxide layer 102 and the semiconductor pattern 108a may be coplanar.

Figure 4:
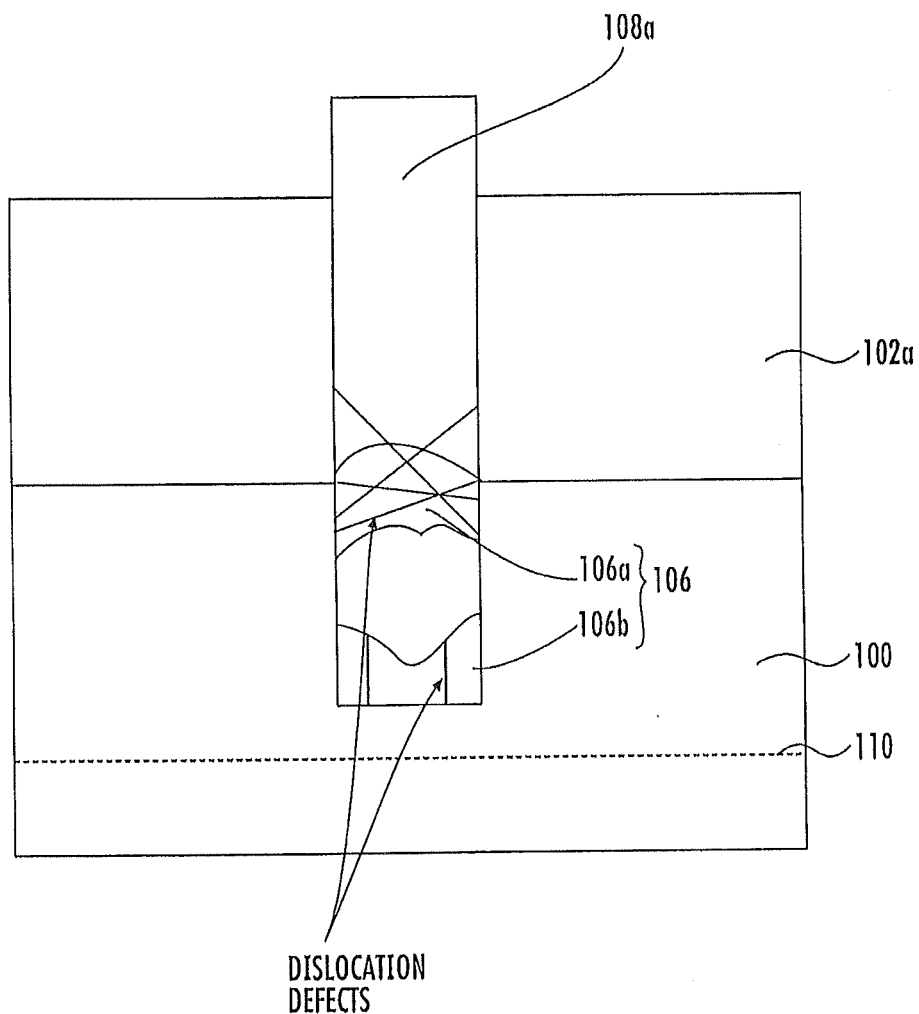

The operations may further include recessing the oxide layer 102 to partially expose the upper portion of the semiconductor pattern 108a (FIG. 4). The oxide layer 102 may be recessed using, for example, an etching process, which selectively removes the oxide layer 102 with respect to the semiconductor pattern 108a. The etching process may be a dry etching process, a wet etching process or a combination thereof. It will be understood that the semiconductor pattern 108a may be used in an integrated circuit device, for example, as a fin-shaped channel region in a Fin-FET (Field Effect Transistor).

According to FIG. 4, the operations may include implanting oxygen ions into the substrate to form an insulating region 110 under the recess 104. The insulating region may be spaced apart from an upper surface of the substrate 100 in a range of about 50 nm to about 100 nm. A dose of oxygen ions may be in a range of about $1 \cdot E17$ atoms/cm$^2$ to about $1 \cdot E19$ atoms/cm$^2$.

Figure 5:
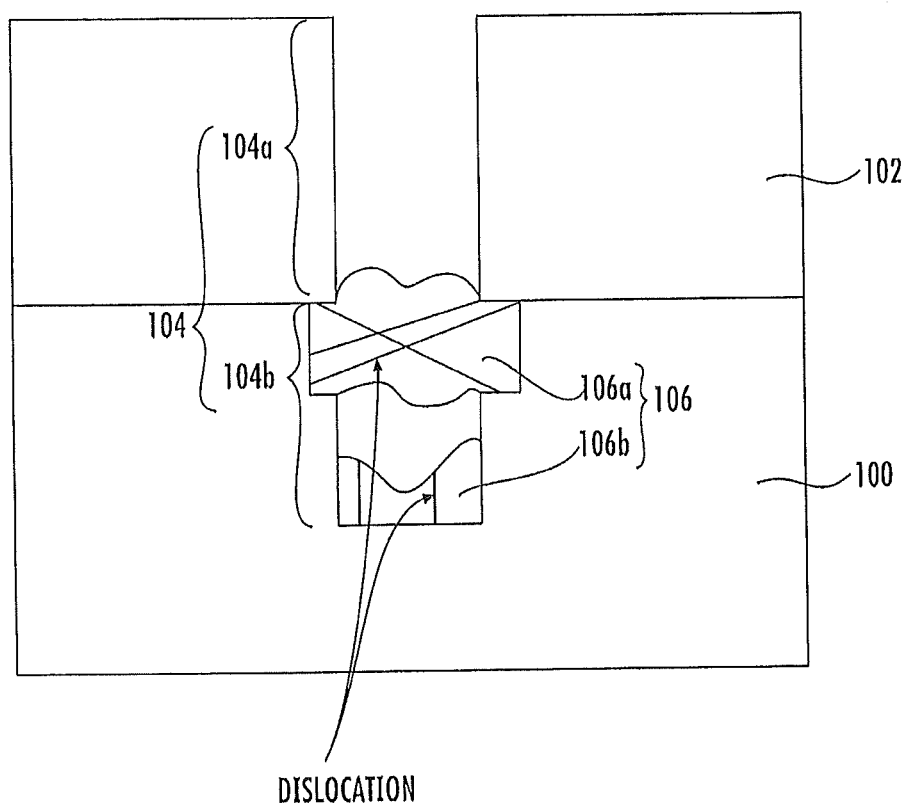
FIG. 5 is a cross-sectional view illustrating an intermediate structure provided in operations of forming a semiconductor pattern according to some embodiments of the present inventive concept.

FIG. 5 is a cross-sectional view illustrating an intermediate structure provided in operations of forming a semiconductor pattern according to some embodiments of the present inventive concept. According to FIG. 5, the operations may additionally include widening an opening of the lower portion of the recess 104b before the first epitaxial growth process. For example, an isotropic etching process, which selectively removes the substrate 100 with respect to the oxide layer 102, may be used to widen the opening of the lower portion of the recess 104b. Widening the opening of the lower portion of the recess 104b may expose portions of a lower surface of the oxide layer 102. As illustrated in FIG. 5, the portions of the lower surface of the oxide layer 102 may additionally trap dislocation defects originating from the interface between the substrate 100 and the overhang seed pattern 106a.

Figure 6:
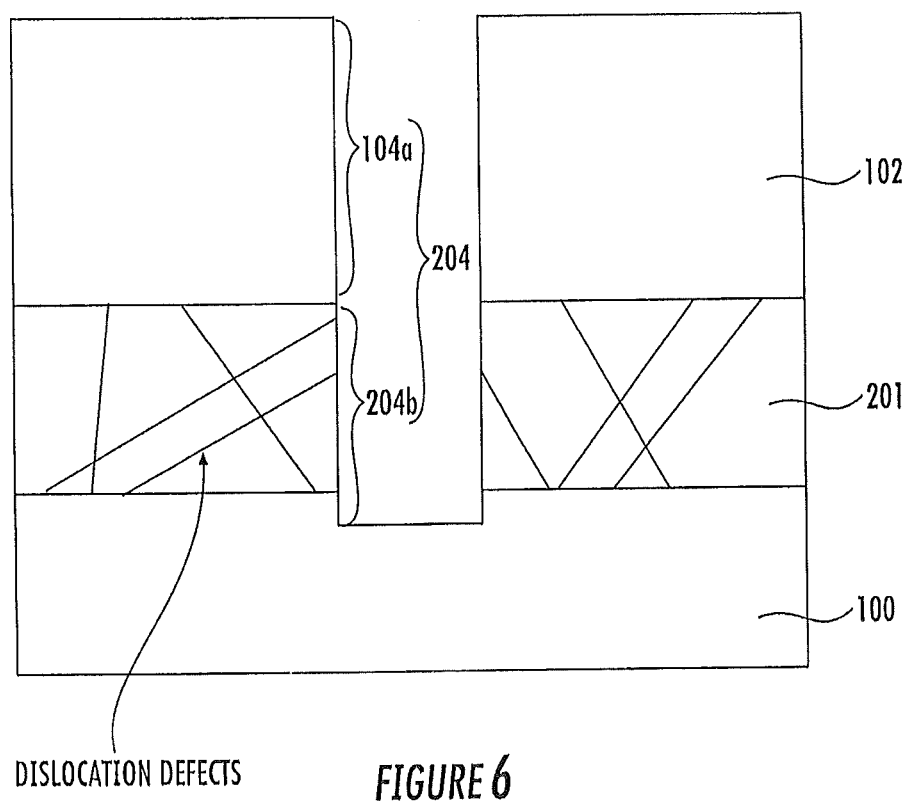
FIGS. 6 through 8 are cross-sectional views illustrating intermediate structures provided in operations of forming a semiconductor pattern according to some embodiments of the present inventive concept.
Figure 7:
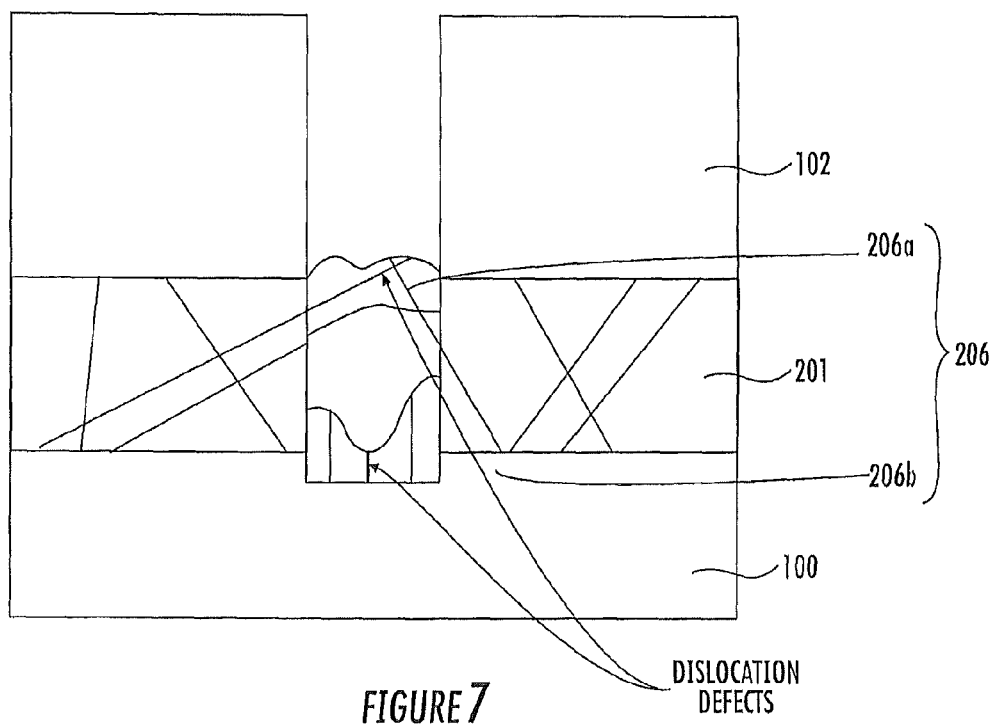
Figure 8:
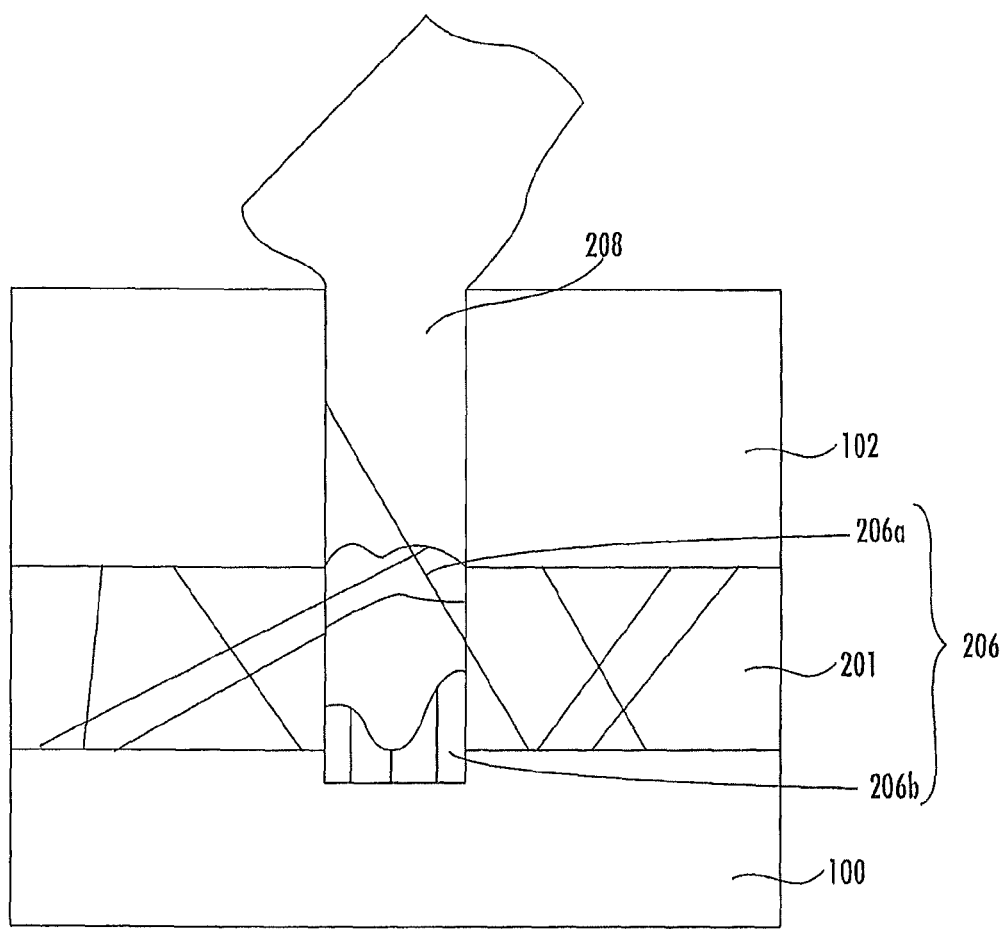

FIGS. 6 through 8 are cross-sectional views illustrating intermediate structures provided in operations of forming a semiconductor pattern according to some embodiments of the present inventive concept.

Referring to FIG. 6, operations of forming a semiconductor pattern may include sequentially forming a semiconductor layer 201 and an oxide layer 102 on a substrate 100. The substrate 100 may include a material different from the semiconductor layer 201. For example, the substrate 100 may include silicon and the semiconductor layer 201 may include germanium, silicon germanium, indium gallium arsenide, or III-V compound. Accordingly, the semiconductor layer 201 may include various dislocation defects, represented by straight lines in FIG. 6, because of strain induced by lattice mismatch at an interface between the substrate 100 and the semiconductor layer 201. It will be understood that most vertical dislocation defects may be trapped by the oxide layer 102 and horizontal dislocation defects may propagate into a semiconductor patterns formed later. A thickness of the semiconductor layer 201 may be in a range of about 100 nm to about 1 μm. The oxide layer 102 may be, for example, a silicon oxide layer.

Still referring to FIG. 6, the operations may include forming a recess 204. The recess 204 may include an upper portion of the recess 104a in the oxide layer 102 and a lower portion of the recess 204b in the semiconductor layer 201 and the substrate 100. In some embodiments, the lower portion of the recess 204b may be only in the semiconductor layer 201 and may not expose the substrate 100.

Referring now to FIG. 7, the operations may include performing a first epitaxial growth process to form seed patterns 206, an overhang seed pattern 206a and a bottom seed pattern 206b, which include a semiconductor material. The overhang seed pattern 206a may be formed using a sidewall of the semiconductor layer 201 at an interface between the oxide layer 102 and the semiconductor layer 201 as a seed layer, and the bottom seed pattern 206b may be formed using the substrate 100 as a seed layer. It will be understood that the sidewall of the semiconductor layer 201 at the interface between the oxide layer 102 and the semiconductor layer 201 may include a portion of the sidewall of the semiconductor layer 201 adjacent the interface between the oxide layer 102 and the semiconductor layer 201. The overhang seed pattern 206a may contact the sidewall of the semiconductor layer 201.

As discussed with reference to FIG. 1, the first epitaxial growth process may selectively form the seed patterns 206 on surfaces of the substrate 100 and the semiconductor layer 201 because both have reactive surfaces any may not form semiconductor patterns on the oxide layer 102. Moreover, the first epitaxial growth process may grow the overhang seed pattern 206a fast. Accordingly, the first epitaxial growth process may result in a void in the lower portion of the recess 204b under the overhang seed pattern 206a. The void may at least partially expose a sidewall of the lower portion of the recess 204b and thus may disconnect the overhang seed pattern 206a and the bottom seed pattern 206b.

According to FIG. 7, the overhang seed pattern 206a and the bottom seed pattern 206b may include dislocation defects, represented by straight lines, originating from interfaces between the substrate 100 and the seed patterns 206 and interfaces between the semiconductor layer 201 and the seed patterns 206. The overhang seed pattern 206a may include horizontal dislocation defects but may not include vertical dislocation defects for reasons discussed herein later.

In some embodiments, the seed patterns 206 and the semiconductor layer 201 may include the same semiconductor material. Accordingly, the overhang seed pattern 206a may be formed on a lattice matched surface such that the overhang seed pattern 206a may not include dislocation defects originating from an interface between the semiconductor layer 201 and the overhang seed pattern 206a. As illustrated in FIG. 7, some horizontal dislocation defects originating from the interface between the substrate 100 and the semiconductor layer 201 may be propagated into the overhang seed pattern 206a. It will be understood, however, that a probability of dislocation defects trapped in the overhang seed pattern 206a may be low because the thickness of the semiconductor layer 201 is thinner than 100 nm, and accordingly a thickness of the overhang seed pattern 206a is thinner than 100 nm. Both of the seed pattern 206 and the semiconductor layer 201 may include, for example, germanium, silicon germanium, indium gallium arsenide, or III-V compound.

In some embodiments, the seed patterns 206 and the semiconductor layer 201 may include different semiconductor materials and the overhang seed pattern 206a may thus be strained due to lattice mismatch at the interface between the semiconductor layer 201 and the overhang seed pattern 206a. Accordingly, the overhang seed pattern 206a may include horizontal dislocation defects originating from the interface between the semiconductor layer 201 and the overhang seed pattern 206a in addition to horizontal dislocation defects originating from the interface between the substrate 100 and the semiconductor layer 201. For example, the semiconductor layer 201 may include silicon germanium and the overhang seed pattern 206a may include germanium. A germanium concentration of the overhang seed pattern 206a may be tailored to form the overhang seed pattern 206a, which is strained but not include many dislocation defects originating from the interface the overhang seed pattern 206a and the semiconductor layer 201.

The bottom seed pattern 206b may include dislocation defects having various directions including vertical dislocation defects. It will be understood that vertical dislocation defects in the bottom seed pattern 206b may not propagate into the overhang seed pattern 206a because the void disconnects the bottom seed pattern 206b from the overhang seed pattern 206a. Accordingly, the overhang seed pattern 206a may not include vertical dislocation defects or may be substantially free of vertical dislocation defects.

As discussed with reference to FIG. 1, it will be understood that aspect ratios of the upper and lower portions of the recess 104a and 204b (in relation to one another) may be predetermined to form the void disconnecting the overhang seed pattern 206a from the bottom seed pattern 206b. In some embodiments, the aspect ratio of the upper portion of the recess 104a may be greater than 1 and the aspect ratio of the lower portion of the recess 204b may be greater than 3. In some embodiments, the upper and lower portions of the recess 104a and 204b may have substantially the same width, and a depth of the lower portion of the recess 204b may be more than three times greater than a depth of the upper portion of the recess 104a.

The operation may additionally include an anneal process after the overhang seed pattern 206a is formed. The anneal process may be performed as an in-situ process that is performed in the same process chamber where the first epitaxial growth process is performed. The anneal process may be performed at a temperature higher than a reflow temperature of the overhang seed pattern 206a to form the overhang seed pattern 206a that substantially completely enclose an opening of the lower portion of the recess 204b. In some embodiments, the overhang seed pattern 206a may include germanium and the anneal process temperature may be in a range of about 500° C. to about 800° C. For example, an anneal process gas may include hydrogen, nitrogen or any inert gas.

Referring now to FIG. 8, the operations may include performing a second epitaxial growth process using the overhang seed pattern 206a as a seed layer to form a preliminary semiconductor pattern 208. As illustrated in the FIG. 8, horizontal dislocation defects in the overhang seed pattern 206a may propagate into the preliminary semiconductor pattern 208 during the second epitaxial growth process. It will be understood, however, that a majority of the horizontal dislocation defects may be trapped in the oxide layer 102 because a thickness of the oxide layer 102 may be predetermined to form the upper portion of the recess 104a having the aspect ratio higher than 1.

An upper portion of the preliminary semiconductor pattern 208 may thus not include horizontal dislocation defects. Further, the upper portion of the preliminary semiconductor pattern 208 may not include vertical dislocation defects because the overhang seed pattern 206a does not include vertical dislocation defects. Accordingly, the upper portion of the preliminary semiconductor pattern 208 may not include dislocation defects or may be substantially free of dislocation defects. The second epitaxial growth process may be performed until the preliminary semiconductor pattern 208 is overgrown such that the upper portion of the preliminary semiconductor pattern 208 may protrude from the recess 204.

Figure 3:
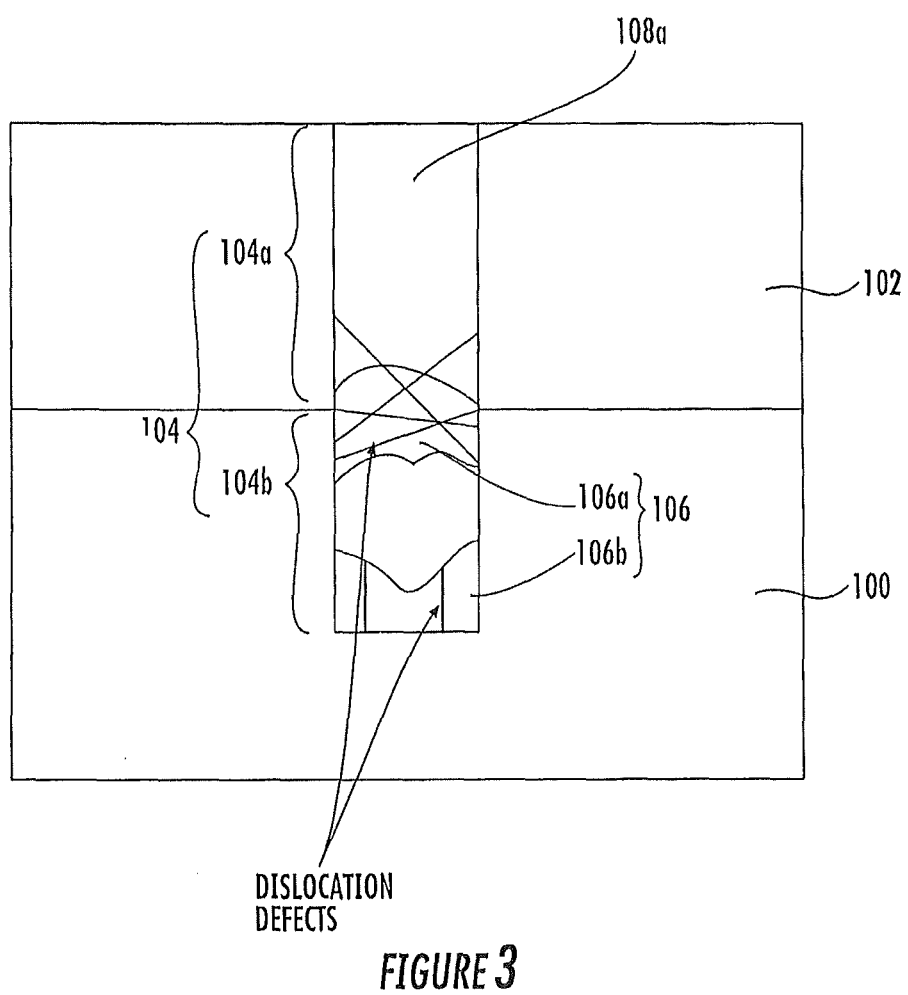

After the second epitaxial growth process, the operations may further include planarizing the upper portion of the preliminary semiconductor pattern 208 to form a semiconductor pattern and recessing the oxide layer 102, which are similar processes to the processes discussed with reference to FIGS. 3 and 4. It will be understood that the semiconductor pattern may be used in an integrated circuit device, for example, as a fin-shaped channel region in a Fin-FET (Field Effect Transistor).

Further, it will be understood that the operations may additionally include widening an opening of the lower portion of the recess 204b before performing the first epitaxial growth process, which is a similar process to the process discussed with reference to FIG. 5.

Figure 9:
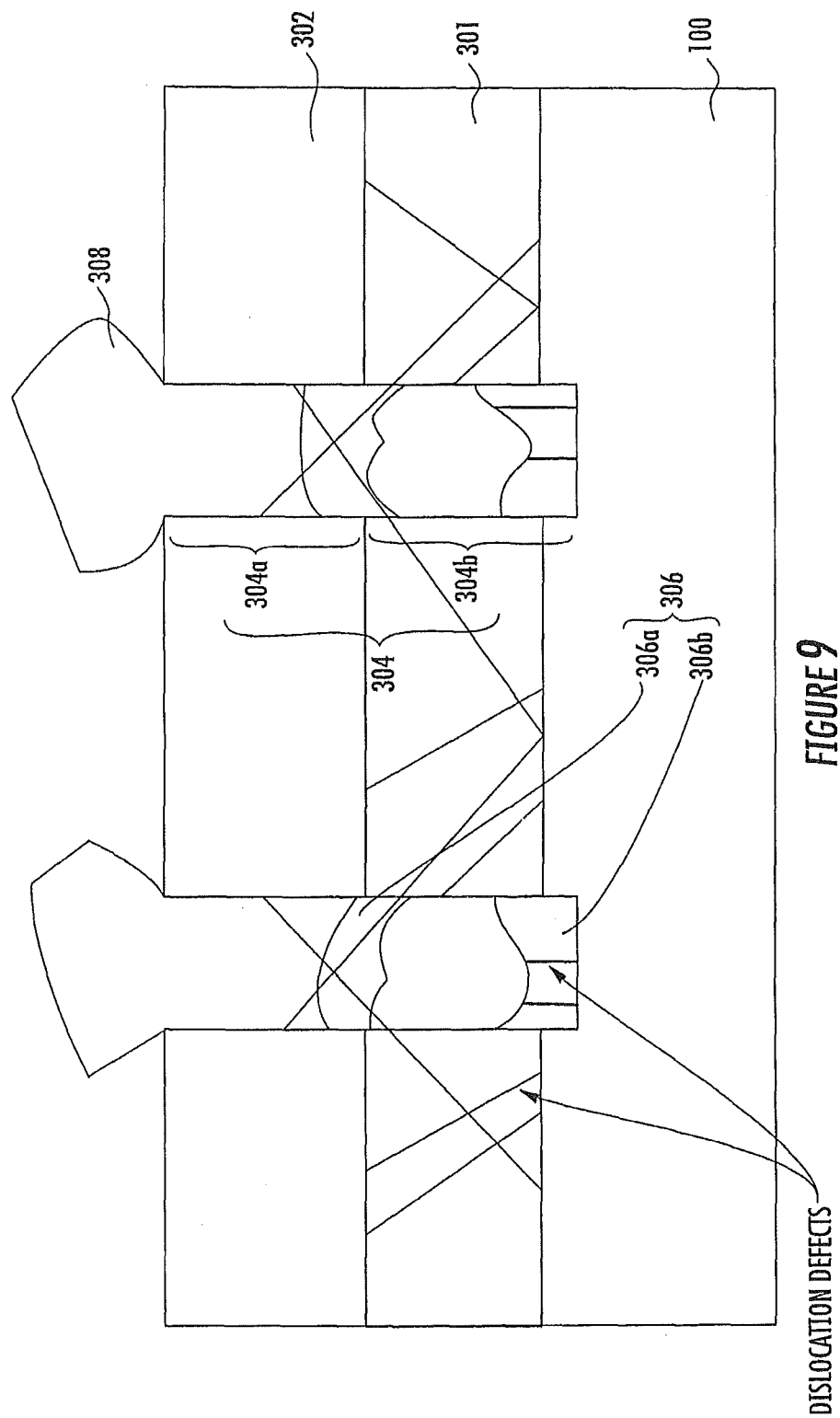
FIGS. 9 and 10 are cross-sectional views illustrating intermediate structures provided in operations of forming a semiconductor layer according to some embodiments of the present inventive concept.
Figure 10:
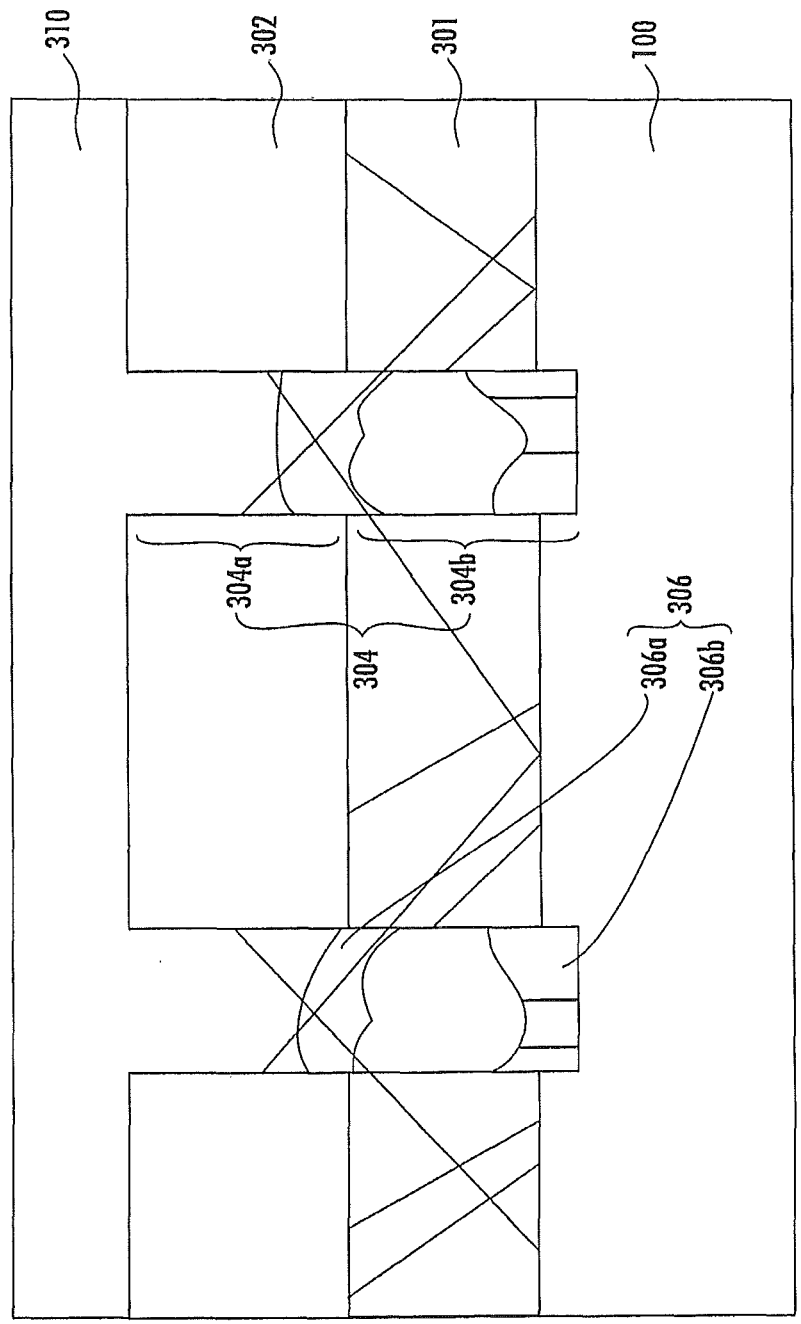

FIGS. 9 and 10 are cross-sectional views illustrating intermediate structures provided in operations of forming a semiconductor layer according to some embodiments of the present inventive concept.

Referring to FIG. 9, operations of forming a semiconductor layer may include sequentially forming a semiconductor seed layer 301 and an oxide layer 302 on a substrate 100. The substrate 100 may include a material different from the semiconductor seed layer 301. For example, the substrate 100 may include silicon and the semiconductor seed layer 301 may include germanium, silicon germanium, indium gallium arsenide, or III-V compound. Accordingly, the semiconductor seed layer 301 may include various dislocation defects, represented by straight lines, originating from an interface between the substrate 100 and the semiconductor seed layer 301.

It will be understood that only some of horizontal dislocation defects originating from an interface between the substrate 100 and the semiconductor seed layer 301 may propagate into a semiconductor patterns formed later because most vertical dislocation defects in the semiconductor seed layer 301 may be trapped by the oxide layer 102. A thickness of the semiconductor seed layer 301 may be in a range of about 100 nm to about 1 µm. The oxide layer 302 may be, for example, a silicon oxide layer.

According to FIG. 9, the operations may include forming recesses 304 in the oxide layer 302, the semiconductor seed layer 301 and the substrate 100. Each of the recesses 304 may include an upper portion of the recess 304a in the oxide layer 302 and a lower portion of the recess 304b in the semiconductor seed layer 301 and the substrate 100. In some embodiments, the lower portion of the recess 304b may be in the semiconductor seed layer 301 and may not expose the substrate 100.

The operations may include performing a first epitaxial growth process, which is a similar process to the process discussed with reference to FIG. 7, to form seed patterns 306 including a semiconductor material in the respective recesses 304. Each of the seed patterns 306 may include an overhang seed pattern 306a and a bottom seed pattern 306b. The overhang seed pattern 306a may be formed using a sidewall of the semiconductor seed layer 301 at an interface between the oxide layer 302 and the semiconductor seed layer 301 as a seed layer, and the bottom seed pattern 306b may be formed using the substrate 100 as a seed layer.

The first epitaxial growth process may result in a void in the lower portion of the recess 304b under the overhang seed pattern 306a, as discussed with reference to FIG. 1. The void may at least partially expose a sidewall of the lower portion of the recess 304b and thus may disconnect the overhang seed pattern 306a from the bottom seed pattern 306b.

In some embodiments, the semiconductor seed layer 301 and the overhang seed pattern 306a may include a semiconductor material, for example, germanium, silicon germanium, indium gallium arsenide, or III-V compound. In some embodiments, the semiconductor seed layer 301 may include and the overhang seed pattern 306a may include different semiconductor materials. For example, the semiconductor seed layer 301 may include silicon germanium and the overhang seed pattern 306a may include germanium.

The overhang seed pattern 306a may include horizontal dislocation defects originating from the interface between the substrate 100 and the semiconductor seed layer 301. In some embodiments, the overhang seed pattern 306a may additionally include horizontal dislocation defects originating from the interface between the semiconductor seed layer 301 and the overhang seed pattern 306a when the semiconductor seed layer 301 and the overhang seed pattern 306a include different semiconductor materials.

The bottom seed pattern 306b may include dislocation defects having various directions, which originate from the substrate 100 and the bottom seed pattern 306b, including vertical dislocation defects. It will be understood that vertical dislocation defects in the bottom seed pattern 306b may not propagate into the overhang seed pattern 206a because the void disconnects the bottom seed pattern 306b and the overhang seed pattern 306a. Accordingly, the overhang seed pattern 306a may not include vertical dislocation defects or may be substantially free of vertical dislocation defects.

Aspect ratios of the upper and lower portions of the recess 304a and 304b (in relation to one another) may be predetermined to form the void disconnecting the overhang seed pattern 306a from the bottom seed pattern 306b. In some embodiments, the aspect ratio of the upper portion of the recess 304a may greater than 1 and the aspect ratio of the lower portion of the recess 304b may be greater than 3. In some embodiments, the upper and lower portions of the recess 304a and 304b may have substantially the same width, and a depth of the lower portion of the recess 304b may be more than three times greater than a depth of the upper portion of the recess 304a.

It will be understood that an anneal process may be additionally performed before the first epitaxial growth process to form the overhang seed pattern 306a on a substantially completely lattice matched surface. A temperature of the anneal process may be higher than a reflow temperature of the semiconductor seed layer 301. For example, the semiconductor seed layer 301 may be a germanium layer and the temperature may be in a range of about 500° C. to about 800° C. An anneal process gas may include, for example, hydrogen, nitrogen or any inert gas.

Further, the operations may further include an anneal process after the first epitaxial growth process. The anneal process may be performed as an in-situ process with respect to the first epitaxial growth process and a anneal process temperature may be higher than a reflow temperature of the overhang seed pattern 306a to form the overhang seed pattern 306a that substantially completely encloses an opening of the lower portion of the recess 304b. In some embodiments, the overhang seed pattern 306a may include germanium and the anneal process temperature may thus be in a range of about 500° C. to about 800° C. For example, an anneal process gas may include hydrogen, nitrogen or any inert gas.

According to FIG. 9, the operations may further include performing a second epitaxial growth process to form semiconductor patterns 308 in the respective recess 304. It will be understood that majority of the horizontal dislocation defects in the overhang seed pattern 306a may be trapped in the oxide layer 302 during the second epitaxial growth process and thus upper portions of the semiconductor patterns 308 may not include horizontal dislocation defects. Further, the upper portions of the semiconductor patterns 308 may not include vertical dislocation defects because the overhang seed patterns 306a may not include vertical dislocation defects. Accordingly, the upper portions of the semiconductor patterns may not include dislocation defects or may be substantially free of dislocation defects. The second epitaxial growth process may be performed until the semiconductor patterns 308 are overgrown such that the upper portions of the semiconductor patterns 308 protrude from the recess 304.

It will be understood that the operations may additionally include widening an opening of the lower portion of the recess 304b before performing the first epitaxial growth process, which is a similar process to the process discussed with reference to FIG. 5.

After the second epitaxial growth process, the operations may further include a third epitaxial growth process to form a semiconductor layer 310 extending on the oxide layer 102 using the plurality of preliminary semiconductor patterns 308 as seed layers (FIG. 10). The plurality of preliminary semiconductor patterns 308 may be laterally grown until adjacent ones of the plurality of preliminary semiconductor patterns 308 contact each other. It will be understood that the semiconductor layer 310 may be a portion of a donor wafer used in manufacturing a semiconductor on insulator, for example, silicon on insulator (SOI), germanium on insulator (GeOI) or III-V compound on insulator (IIIVOI).

In some embodiments, the operations may additionally include an anneal process after the third epitaxial growth process to reduce grain boundaries in the semiconductor layer 310. A anneal temperature may be higher than a reflow temperature of the semiconductor layer 310. For example, the semiconductor layer 310 may be a germanium layer and the anneal temperature may be in a range of about 500° C. to about 800° C. An anneal process gas may include, for example, hydrogen, nitrogen or any inert gas.

Further, a protection layer may be formed on the semiconductor layer 310. The protection layer may be a silicon oxide layer. It will be understood that a CMP process may be additionally performed on the semiconductor layer 310 before forming the protection layer.

Figure 11A:
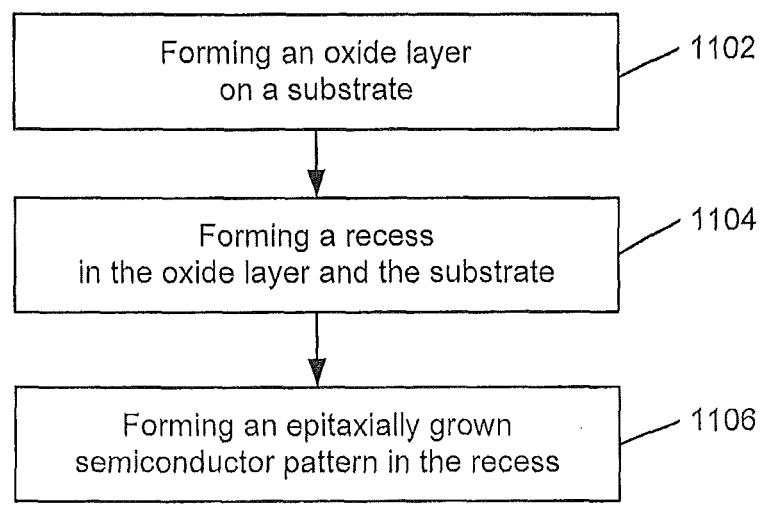
FIGS. 11A and 11B are flowcharts illustrating operations of forming a semiconductor pattern according to some embodiments of the present inventive concept.
Figure 11B:
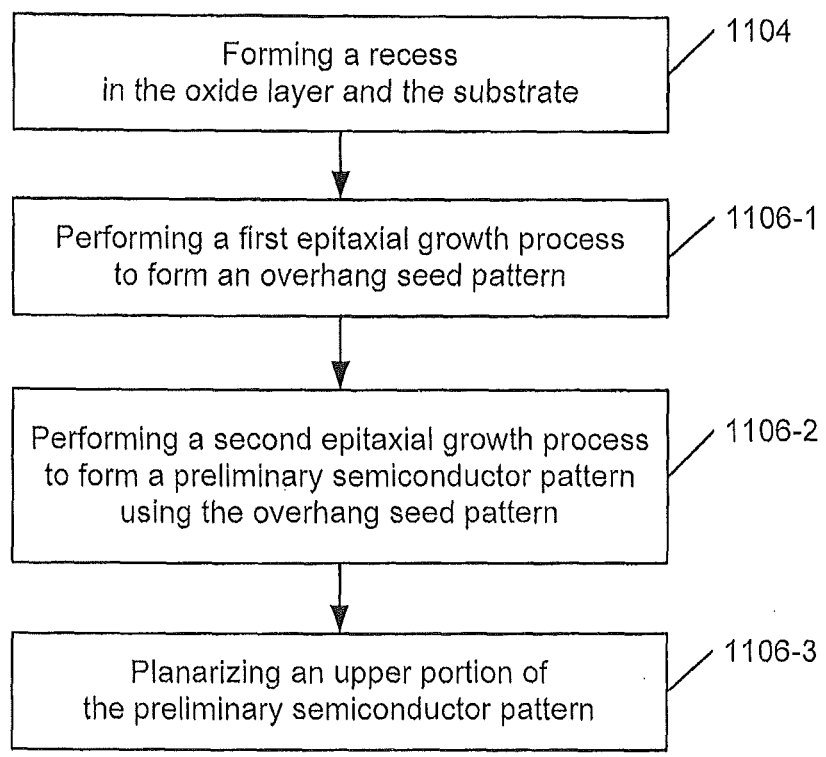

FIGS. 11A and 11B are flowcharts illustrating operations of forming a semiconductor pattern according to some embodiments of the present inventive concept. According to FIG. 11A, the operations may include forming an oxide layer on a substrate (Block 1102). In some embodiments, the substrate may include two semiconductor layers. For example, a lower layer of the substrate may include silicon and an upper layer extending between the lower layer and the oxide layer may include germanium, silicon germanium, indium gallium arsenide, or III-V compound. The operations may include forming a recess in the oxide layer and the substrate (Block 1104). The recess may be formed using photolithography and etching processes. The etching process may be an anisotropic etching process and may be wet etching process, dry etching process or a combination thereof. Moreover, the operations may additionally include forming an epitaxially grown semiconductor pattern in the recess, which may define an upper surface of a void (Block 1106).

As discussed with reference to FIG. 1, the recess may have an aspect ratio high enough such that the void is formed in the recess under the epitaxially grown semiconductor pattern. The aspect ratio of the recess may be greater than 4.

According to FIG. 11B, forming the epitaxially grown semiconductor pattern in Block 1106 may include performing a first epitaxial growth process to form an overhang seed pattern (Block 1106-1). As discussed with reference to FIG. 1, the first epitaxial growth process may form the overhang seed pattern 106a using the sidewall of the substrate 100 at the interface between the substrate 100 and the oxide layer 102 as a seed layer, and the overhang seed pattern 106a may define the upper surface of the void disposed in the lower portion of the recess 104b. The overhang seed pattern 106a may contact the portion of the sidewall of the substrate 100 at the interface between the substrate 100 and the oxide layer 102. It will be understood that the sidewall of the substrate 100 at the interface between the substrate 100 and the oxide layer 102 may include a portion of the sidewall of the substrate 100 adjacent the interface between the substrate 100 and the oxide layer 102.

Moreover, forming the epitaxially grown semiconductor pattern in Block 1106 may include performing a second epitaxial growth process using the overhang seed pattern as a seed layer to form a preliminary semiconductor pattern in the recess (Block 1106-2). The second epitaxial growth process may be performed until the preliminary semiconductor pattern is overgrown such that an upper portion of the preliminary semiconductor pattern may protrude from the recess. It will be understood that the upper portion of the preliminary semiconductor pattern may not include dislocation defects, vertical and horizontal dislocation defects, for reasons discussed with reference to FIG. 1.

The operations may include planarizing the upper portion of the preliminary semiconductor pattern to form the semiconductor pattern (Block 1106-3). After planarization, upper surfaces of the semiconductor pattern and the oxide layer may be coplanar.

Figure 12A:
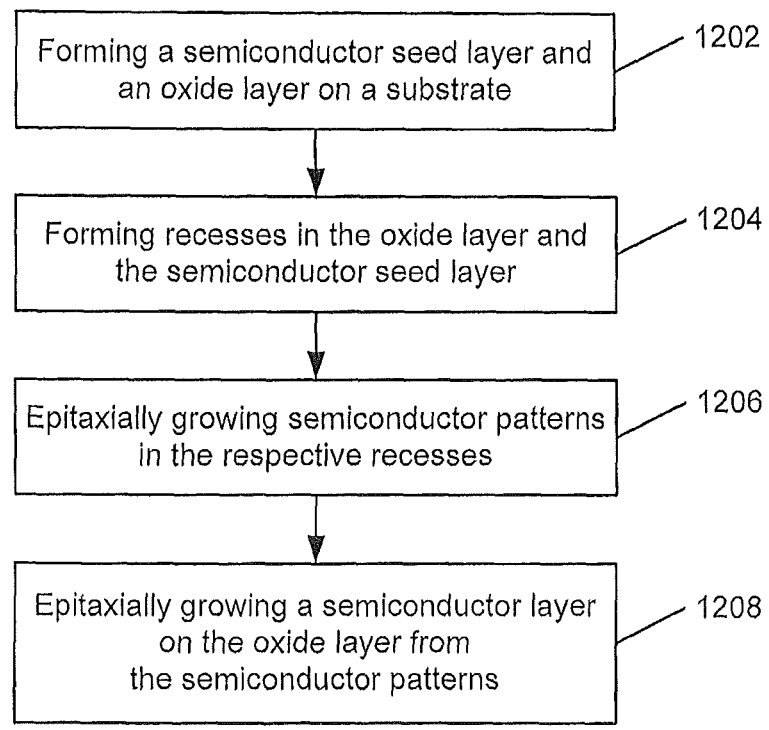
FIGS. 12A and 12B are flowcharts illustrating operations of forming a semiconductor layer according to some embodiments of the present inventive concept.
Figure 12B:
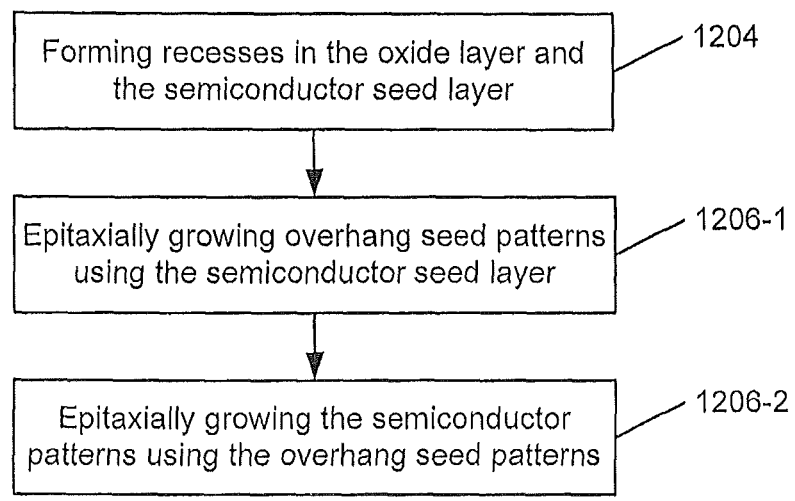

FIGS. 12A and 12B are flowcharts illustrating operations of forming a semiconductor layer according to some embodiments of the present inventive concept. According to FIG. 12A, the operations may include forming a semiconductor seed layer and an oxide layer on a substrate (Block 1202). The semiconductor seed layer and the substrate may include different semiconductor materials and, for example, the semiconductor seed layer may include germanium and the substrate may include silicon. The oxide layer may be, for example, silicon oxide.

The operations may include forming recesses in the oxide layer and the semiconductor seed layer (Block 1204). In some embodiments, each of the recesses may be in the semiconductor seed layer and in the substrate as well. In some embodiments, each of the recess may not expose the substrate. Each of the recesses may have a high aspect ratio and may be greater than 4.

The operations may include epitaxially growing semiconductor patterns in the respective recesses, which define upper surfaces of voids in the respective recesses, for example, as illustrate in FIG. 9 (Block 1206). Additionally, epitaxially growing a semiconductor layer extending on the oxide layer from the semiconductor patterns may be performed (Block 1208).

Referring now to FIG. 12B, epitaxially growing the semiconductor patterns may include epitaxially growing overhang seed patterns in the respective recesses using the semiconductor seed layer (Block 1206-1). The overhang seed patterns may contact a sidewall of the semiconductor seed layer at an interface between the semiconductor seed layer and the substrate and may define the upper surfaces of respective voids in the recesses. Further, epitaxially growing the semiconductor patterns may be performed using the overhang seed patterns as seed layers (Block 1206-2). The semiconductor patterns may be overgrown such that upper portions of the semiconductor patterns protrude from the recess.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor pattern, the method comprising:
   forming an oxide layer on a substrate;
   forming a recess in the oxide layer and the substrate; and
   forming an epitaxially grown semiconductor pattern in the recess, which contacts a sidewall of the substrate at an interface between the oxide layer and the substrate and defines an upper surface of a void in the recess in the substrate.

2. The method of claim 1, wherein forming the recess comprises forming a lower portion of the recess in the substrate having an aspect ratio greater than 3 such that the void exposes the sidewall of the substrate.

3. The method of claim 1, wherein forming the recess comprises forming an upper portion of the recess through the oxide layer having an aspect ratio greater than 1.

4. The method of claim 1, further comprising:
implanting oxygen ions into the substrate to form an insulating region under the recess.

5. The method of claim 1, further comprising:
widening a portion of the recess in the substrate at the interface of the substrate and the oxide layer to form an undercut region.

6. The method of claim 1, wherein forming the epitaxially grown semiconductor pattern comprises:
epitaxially growing a lower semiconductor pattern defining the upper surface of the void in the recess in the substrate using the sidewall of the substrate at the interface between the oxide layer and the substrate as a first seed layer; and
epitaxially growing an upper semiconductor pattern in the recess using the lower semiconductor pattern as a second seed layer.

7. The method of claim 6, wherein the void exposes the sidewall of the substrate.

8. The method of claim 6, wherein the lower semiconductor pattern comprises a material different from the upper semiconductor pattern.

9. The method of claim 8, wherein the lower semiconductor pattern comprises silicon germanium (SiGe), and the upper semiconductor pattern comprises germanium (Ge).

10. The method of claim 1, wherein:
the substrate comprises a first semiconductor layer and a second semiconductor layer extending between the oxide layer and the first semiconductor layer;
the second semiconductor layer comprises germanium (Ge), silicon germanium (SiGe), indium gallium arsenide (InGaAs), or a III-V compound; and
the epitaxially grown semiconductor pattern contacts a sidewall of the second semiconductor layer.

11. The method of claim 10, wherein a thickness of the second semiconductor layer is in a range of about 100 nm to about 1 µm.

12. A method of forming a fin-shaped semiconductor pattern, the method comprising:
forming an oxide layer on a substrate;
forming a recess through the oxide layer and in the substrate;
performing a first epitaxial growth process to form an overhang seed layer in the recess using a sidewall of the substrate at an interface between the oxide layer and the substrate as a first seed layer, the overhang seed layer defining an upper surface of a void in the recess;
performing a second epitaxial growth process to form a semiconductor pattern in the recess using the overhang seed layer as a second seed layer; and
recessing the oxide layer to form the fin-shaped semiconductor pattern by exposing an upper portion of the semiconductor pattern.

13. The method of claim 12, wherein:
performing the first epitaxial growth process further comprises forming a bottom seed pattern on a bottom of the recess; and
the overhang seed layer is isolated from the bottom seed pattern.

14. The method of claim 12, wherein:
the substrate comprises a first semiconductor layer and a second semiconductor layer extending between the oxide layer and the first semiconductor layer, the second semiconductor layer comprising germanium (Ge), silicon germanium (SiGe), indium gallium arsenide (InGaAs), or a III-V compound; and
the recess exposes a sidewall of the second semiconductor layer comprising the first seed layer.

15. The method of claim 14, wherein a thickness of the second semiconductor layer is in a range of about 100 nm to about 1 µm.

16. A method of forming a semiconductor layer, the method comprising:
sequentially forming a semiconductor seed layer and an oxide layer on the substrate;
forming a plurality of recesses in the oxide layer and the semiconductor seed layer;
epitaxially growing a plurality of semiconductor patterns in the respective plurality of recesses using portions of sidewalls of the semiconductor seed layer at an interface between the oxide layer and the semiconductor seed layer as seed layers until upper portions of the plurality of semiconductor patterns protrude from the respective plurality of recesses, the plurality of semiconductor patterns defining upper surfaces of a plurality of voids in the respective plurality of recesses; and
epitaxially growing the semiconductor layer extending on the oxide layer using the plurality of semiconductor patterns as seed layers.

17. The method of claim 16, wherein:
forming the plurality of recesses comprises forming lower portions of the plurality of recesses in the semiconductor seed layer; and
each of the lower portions of the plurality of recesses has an aspect ratio greater than 3 such that the each of the plurality of voids exposes the sidewalls of the semiconductor seed layer.

18. The method of claim 16, wherein a thickness of the semiconductor seed layer is in a range of about 100 nm to about 1 µm.

19. The method of claim 16, wherein epitaxially growing the plurality of semiconductor patterns comprises:
epitaxially growing a plurality of lower semiconductor patterns defining the upper surfaces of the respective plurality of voids using the portions of sidewalls of the semiconductor seed layer at the interface between the oxide layer and the semiconductor seed layer as the seed layers; and
epitaxially growing a plurality of upper semiconductor patterns in the respective plurality of recesses from the respective plurality of lower semiconductor patterns.

20. The method of claim 19, wherein:
epitaxially growing the plurality of upper semiconductor patterns comprises growing the plurality of upper semiconductor patterns protruding from the respective plurality of recesses; and
epitaxially growing the semiconductor layer comprises laterally growing the plurality of upper semiconductor patterns until adjacent ones of the plurality of upper semiconductor patterns contact each other.

* * * * *